United States Patent [19]

Wright

[11] Patent Number: 5,061,871
[45] Date of Patent: Oct. 29, 1991

[54] ELECTRODE STRUCTURE WITH CONSTANT VELOCITY AND ZERO REFLECTIVITY

[75] Inventor: Peter Wright, Dallas, Tex.

[73] Assignee: R. F. Monolithics, Inc., Dallas, Tex.

[21] Appl. No.: 646,066

[22] Filed: Jan. 25, 1991

[51] Int. Cl.⁵ .............................................. H01L 41/08
[52] U.S. Cl. ........................... 310/313 B; 310/313 D; 333/154; 333/195
[58] Field of Search ............ 310/313 R, 313 B, 313 D; 333/193–195, 150, 151, 153, 154

[56] References Cited

U.S. PATENT DOCUMENTS 4,728,912 3/1988 Yuhara et al. .............. 310/313 B X

Primary Examiner—Mark O. Budd
Attorney, Agent, or Firm—Jones, Day, Reavis & Pogue

[57] ABSTRACT

An electrode structure for use with a surface acoustic wave device which has the same velocity as the transducers and the gratings forming the device but no reflections and which can be used to vary structure reflectivity.

18 Claims, 7 Drawing Sheets

ELECTRODE STRUCTURE WITH CONSTANT VELOCITY AND ZERO REFLECTIVITY

FIELD OF THE INVENTION

The present invention relates to electrode structures for surface acoustic wave devices in general and specifically to surface acoustic wave resonators with transducers and/or gratings formed with electrode structures that have constant velocity and no reflections.

BACKGROUND OF THE INVENTION

It is well known in the surface acoustic wave art that resonators pose a particular problem in their construction. Resonators require a constant velocity throughout their structure and typically include first and second reflective gratings with first and second spaced transducers inserted between the gratings. If the transducers are very close to each other, electromagnetic cross-talk occurs because the transducers are very capacitive. Thus, they must be separated or isolated from each other electrically. When they are separated, an unmetalized region occurs between the two transducers. That region does not have the same velocity as the metalized regions, those having the transducer electrodes or the reflective gratings thereon. This means that the unmetalized region or cavity is no longer resonant at the same frequency as the gratings or the transducer. Therefore, the cavity must be changed in length to perturb the frequency. This is a very complicated process but must be accomplished since the cavity, without electrodes, causes an insertion loss and distortion of the phase response of the resonator.

Thus, a center grating must be added to cause a constant velocity through the region separating the two transducers. Further, it is often desired that the center gratings do not cause reflections. If $\lambda/4$ electrodes are used as the coupling grating, the velocity of the acoustic waves through the cavity is constant, but reflections occur from the center grating electrodes. Split-finger electrodes, well known in the art, could be used as a center grating and no reflections would occur, but then the velocity through the region would be different because there are a different number of edges per given length. Thus, with $\lambda/4$ electrodes, there are four edges for the two electrodes and a 50/50 metallization or 50% of the region is metalized and 50% is free space. If split-finger electrodes are used, there is still a 50/50 metallization to free space ratio, but there are now eight reflector edges instead of four. The velocity of the acoustic wave is affected by energy stored at the electrode edges and the split-finger electrode has twice as many edges. Thus, the velocity through the split-finger electrodes is different than the velocity through a structure having $\lambda/4$ electrodes.

Further, it is also known in such resonators that the resonators are most generally constructed with uniformly distributed reflectors. For example, all electrodes may be $\lambda/4$ in width and separated by $\lambda/4$ free space regions. The reflection characteristic of a uniform reflector has relatively strong side lobes. In order to reduce this disadvantage, withdrawal weighted reflector gratings are used. Withdrawal weighting is the selective omission, or withdrawing, of reflective elements or electrodes. Proper withdrawal weighting causes reduced reflection side lobes. However, as soon as some of the electrode fingers or elements are removed, the velocity is changed through the grating, thus creating distortion and insertion loss. In order to compensate for these disadvantages in the prior art, the remaining electrodes have to be shifted or moved to a different position on the substrate to compensate for the missing electrodes. In order to determine where the electrodes must be positioned, one has to know the acoustic velocity on the free area compared to what it is on the metalized surface and the calculations become very complicated and precise placement of the electrodes is almost impossible. Further, the electrodes are no longer on equally-spaced grids because they vary in position nonlinearly and thus it is impossible to make such a mask with an E-beam. E-beam systems are well known in the art and basically include an electron beam to write the desired pattern on a photoresist. The E-beam operates digitally on a grid system. Further, with each different type of metal that is used or with a change in metal thickness, new calculations have to be performed because of the different velocities relating to the different metals or different thicknesses and thus a separate mask must be designed for each different type of metal or metal thickness used.

In commonly assigned copending application Serial No. 608,354, filed Nov. 2, 1990, and incorporated herein in its entirety by reference, there is disclosed a group-type structure with $3/8\lambda$ and $5/8\lambda$ sampling. Reflectionless transducers and broadband notch elements are all implementable with those new configurations. Although they are reflectionless, they do not have the same velocity as a structure having electrodes with a width of $\lambda/4$ and separated by a gap of $\lambda/4$. This structure is generally known as a two-electrode-per-wavelength structure. In commonly assigned copending application Ser. No. 510,964, filed Apr. 19, 1990, and incorporated herein by reference in its entirety, an electrode structure is disclosed which has no reflections and has the velocity of a uniform two-electrode-per-wavelength structure. One disadvantage of this structure is that it has substantially lower coupling than the uniform two-electrode-per-wavelength structure. Further, because of the very narrow electrode width in the structures, $1/8\lambda$ the electrodes tend to have a resistance loss. Thus, it has two disadvantages first it has lower coupling than a uniform two-electrode-per-wavelength structure and second it has higher resistance because of the narrow $1/8\lambda$ lines.

The present invention has the advantages of both the group-type coupling and the constant velocity of a uniform two-electrode-per-wavelength structure. Thus, there is higher coupling and lower resistance.

To construct such a surface acoustic wave structure having no reflections and the velocity of a uniform two-electrode-per-wavelength structure, multiple electrodes are placed on a piezoelectric substrate with only four spaced electrodes for each $2\lambda$ distance of structure. The electrodes are all one-quarter wavelength and are separated from each other by a space of $\lambda/8$. A space of $5/16\lambda$ on each end of the group completes a $2\lambda$ distance. Thus in an electrode distance of $2\lambda$, the structure has fifty percent metallization, it has the same metal thickness everywhere and the same number of edges as the uniform two-electrode-per-wavelength structure and it has no reflectivity. These groups repeat as necessary along the electrode structure. Because the group of electrodes consists of electrodes having a width of $\lambda/4$ and separated by a gap of $\lambda/8$, the structure inherently cancels reflections among all four electrodes so that no reflections occur outside the group. Thus, a large number of groups would have no reflections in the entire structure because of the reflectionless nature of each group of electrodes. The 5/8λ gap that separates adjacent groups simply keeps the transduction in phase from one group to the next group. Thus, the special configuration of the electrodes and spaces in each group give zero reflectivity within each group while the 5/8λ space separating adjacent groups keeps the transduction in phase between groups. This structure, then, has the advantages of the group-type structure and the advantages of the zero reflectivity structures as set forth in the copending applications described earlier.

Again, the structure has constant velocity because, over the entire electrode structure, only two electrodes per wavelength are used. Thus, it is acoustically equivalent to a uniform λ/4 structure with two electrodes per wavelength. It has a metal-to-free-space ratio of 50/50 and it has the same number of electrode edges as a structure having two electrodes per wavelength. Thus, the velocity through the structure is constant. It has no reflections because the four electrodes in any group when considered together cancel the reflections from each other because of the particular spacing and width of electrodes used. Therefore, this structure has the equivalent velocity performance of a two-electrode-per-wavelength structure, but it has no reflectivity as does the two-electrode-per-wavelength structure. This structure can be used in either gratings or transducers to cause nonreflective gratings or nonreflective transducers but both of which have constant velocity throughout the structure.

Where it is desirable to have a two electrode per wavelength transducer or grating with variable reflectivity, such as the case with external gratings where it may be desired, for example, to have a tapered reflectivity to reduce side lobes and insertion loss, the structure having two electrodes per wavelength is arranged such that 2λ distances of electrodes in the two-electrode-per-wavelength structure are replaced with the groups of electrodes set forth in the present invention. These inserted structures will have the same velocity as the two-electrode-per-wavelength grating or transducer but will have no reflections. Thus, the grating or transducer can be withdrawal weighted as desired to change the reflectivity of the grating or transducer as a whole. By combining the nonreflective structure disclosed herein and the reflective structures of the prior art, greater control over the amount of reflectivity of a transducer or grating structure can be controlled to obtain any desired tapering of the reflectivity.

Thus, an important aspect of the present invention is to provide an electrode structure that has the same velocity as a two-electrode-per-wavelength structure but has substantially no reflectivity.

It is another aspect of the present invention to provide a group of only four spaced electrodes on a substrate for at least one 2λ distance of electrode structure with each of the electrodes having a width of substantially λ/4 and a center-to-center spacing of substantially 3/8λ between adjacent ones of the four spaced electrodes such that the electrode structure has the velocity of the uniform two-electrode-per-wavelength structure and no reflections.

It is still another aspect of the present invention to provide withdrawal weighting of an electrode structure without changing the velocity through the structure.

SUMMARY OF THE INVENTION

Thus, the present invention relates to an electrode structure for transducing acoustic waves and having a piezoelectric substrate, a group of only four spaced electrodes on the substrate for each 2λ distance of electrode structure, each of the electrodes having a width of substantially λ/4, and a center-to-center spacing of substantially 3/8λ between adjacent ones of the four spaced electrodes and a 5/8λ space separating adjacent groups such that the electrode structure has the velocity of a uniform two-electrode-per-wavelength structure with substantially no reflections.

The invention also relates to a withdrawal weighted electrode structure for a surface acoustic wave device having a piezoelectric substrate with multiple λ/4 electrodes thereon and a center-to-center spacing of λ/2, selected 2λ portions of the electrodes each having a group of only four spaced electrodes, each electrode having a width of λ/4 and a center-to-center spacing of 3/8λ between adjacent ones of the four spaced electrodes in each group and a 5/8λ spacing between each group of four electrodes and the nearest adjacent electrode so as to form an electrode structure having a predetermined reflection coefficient, K, and the constant velocity of a uniform two-electrode-per-wavelength structure.

The invention also relates to resonators and coupled resonators that utilize the present invention to vary the reflectivity of the structures but maintain the same velocity.

BRIEF DESCRIPTION OF THE DRAWINGS

These and other objects of the present invention will be more fully understood in conjunction with the accompanying drawings in which like numbers indicate like components and in which.

DETAILED DESCRIPTION OF THE DRAWINGS

Figure 1:
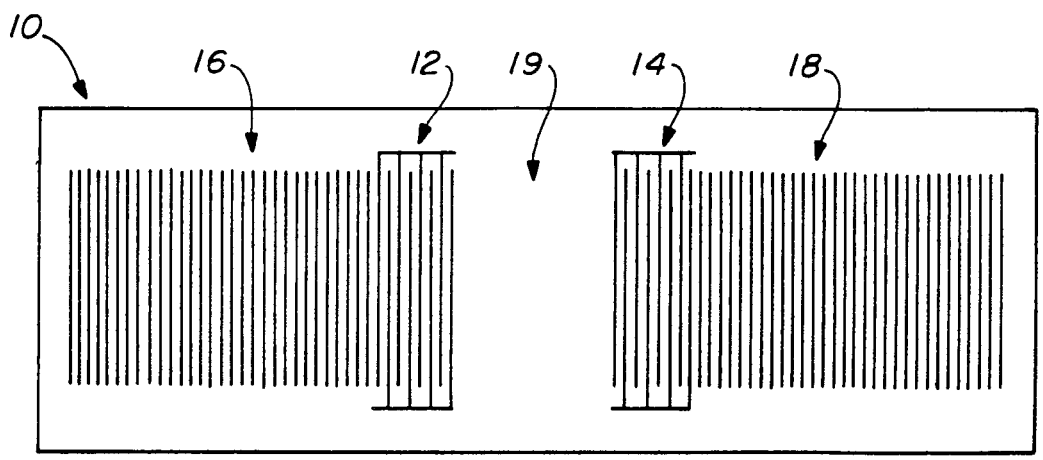
FIG. 1 is a diagrammatic representation of a prior art resonator.

FIG. 1 is a diagrammatic representation of a prior art resonator 10 illustrating the two transducers 12 and 14 separating external reflective gratings 16 and 18. A cavity or free space area 19 separates the two transducers 12 and 14. In FIG. 1, if the two transducers 12 and 14 could be placed in abutting relationship with each other, there would be a constant velocity throughout the structure, which is desirable. However, when the transducers 12 and 14 are placed in abutting relationship or near each other, then electromagnetic cross-talk exists because the transducers 12 and 14 are very capacitive. Thus, they have to be separated or isolated from each other electrically. When that occurs, the unmetalized region 19 is formed in the center of the device. The region 19 will not have the same velocity as the partially metalized surfaces where the transducers 12 and 14 and the gratings 16 and 18 are located. The change in velocity means that the resonant frequency of the cavity 18 does not coincide with the resonant frequency of the gratings and transducers, so an increased insertion loss and distortion of the phase response is created. In order to compensate for the difference in velocity, it is necessary to change the separation distance 19 so it is not a multiple of $\lambda/4$. This, however, requires a knowledge of exactly how much the velocity has changed by having the region 19 unmetalized. The structure is no longer periodic and the change in cavity length may be compensated by proper adjustment of the length of the cavity by proper positioning of the electrodes. However, such technique is very complicated and imprecise and depends upon metal thickness and knowing how far to move the electrodes.

Another way to compensate for the change in velocity caused by the free space region 19 is to place a grating in cavity 19 to create a constant velocity in the region. However, a $\lambda/4$ grating has strong reflectivity and thus has to be designed to operate at a different frequency than the reflective gratings 16 and 18. Thus, it is designed to be, for example, higher or lower in frequency by some value such as 20% to minimize distortions caused by reflections from the grating. However, the structure is then no longer on a fixed grid and still has some reflectivity. If the frequency is changed too much, the velocity is no longer constant.

Figure 2:
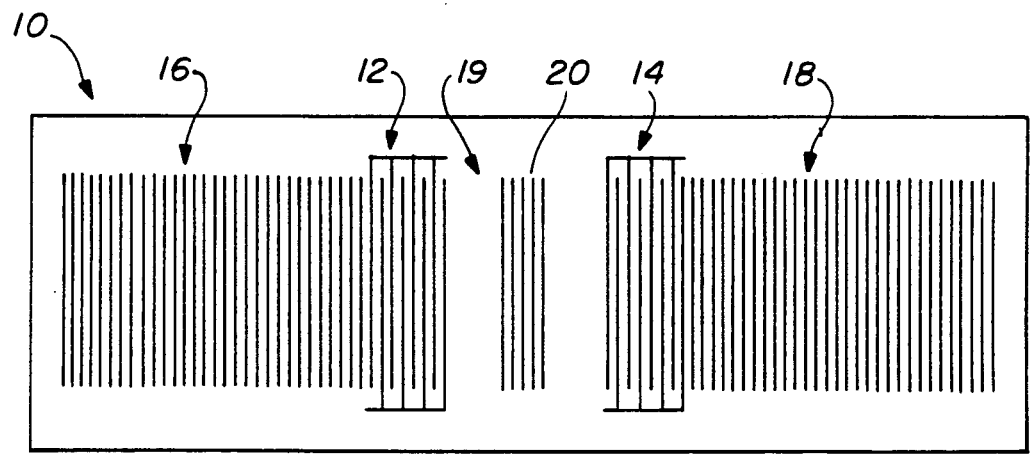
FIG. 2 is a diagrammatic representation of a prior art coupled resonator.

The same problem occurs with a prior art coupled resonator, as illustrated in FIG. 2. In a coupled resonator, the ideal center grating 20 is placed in the free space region between transducers 12 and 14. The purpose of the center grating 20 between transducers 12 and 14 is to keep the transducers 12 and 14 electrically isolated from each other and yet have a constant acoustic velocity in the region between the transducers 12 and 14 with no reflections.

However, in both the resonator of FIG. 1 and the coupled resonator of FIG. 2, it may be desirable to taper the reflectivity of the external gratings 16 and 18 to reduce side lobe amplitude and phase distortion. In the prior art this is done by weighted withdrawal of the electrodes. Thus, some of the electrodes are actually physically omitted from their normal positions on the substrate. However, as soon as the electrodes are omitted, and free spaces are created on the substrate, the velocity of the acoustic signal through the grating is changed. To know how to compensate by spacing the electrodes is very difficult because of the velocity changes with the thickness, type, width and placement of the electrodes. To place the electrodes properly, one must know how the velocity is affected by the metal electrodes and how the velocity changes with metal thickness. It has to be measured experimentally and it is not an accurate procedure. Further, once the calculations are made and a production mask is designed for a fixed metal thickness, if the metal thickness is changed or a different metal is used, then the entire mask needs redesigning for optimum performance.

The present invention overcomes these disadvantages of the prior art by providing electrode structures that either have a reflection coefficient $K=$ zero or K is a predetermined amount and yet the velocity throughout the structure is held constant. The invention provides the ability to either specifically reduce or completely eliminate reflections while maintaining constant velocity through the electrode structure.

Figure 3:
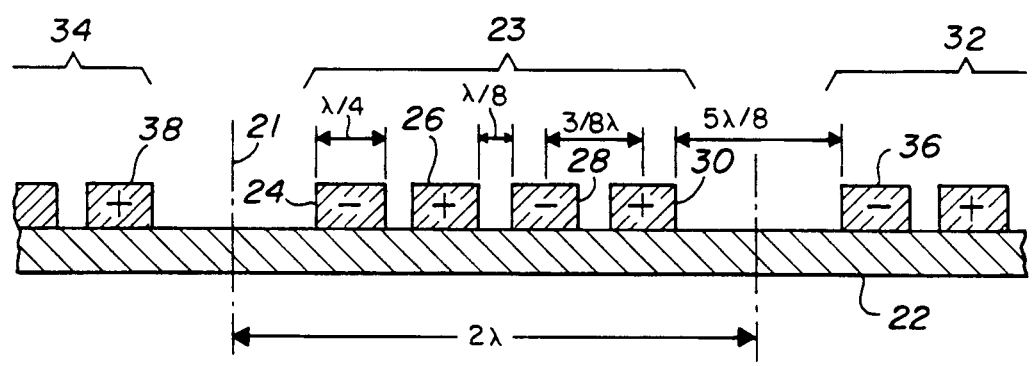
FIG. 3 is a schematic cross-sectional representation of a portion of an electrode structure in which, in a 2λ wavelength distance, four electrodes are used and in which each of the electrodes has a width of substantially λ/4 and a distance between electrodes of λ/8 with a distance of 5λ/8 separating each group of electrodes from adjacent electrodes to provide a structure with no reflections and constant velocity through the structure.

A $2\lambda$ length of electrode structure of the present invention is illustrated in FIG. 3. In this structure, the reflectivity is totally eliminated while holding the velocity constant. Thus, the reflection coefficient, K, is zero. In the typical two-electrode-per-wavelength structure normally used in resonator transducers and gratings, there is a particular velocity because the metallization of the substrate is 50/50 and the electrode edges are eight edges per $2\lambda$ distance. In the structure illustrated in FIG. 3, these characteristics have not changed. The metallization still covers one-half of the structure area and free space occupies the other half. There are still four electrodes with eight edges in the $2\lambda$ distance. Thus, the velocity has not changed and is constant throughout the structure. Substrate 22, which may be a piezoelectric material, is shown in FIG. 3 with a $2\lambda$ group 23 of electrodes 24, 26, 28 and 30. Each of the electrodes 24–30 has a width of substantially $\lambda/4$ and a center-to-center spacing of substantially $3/8\lambda$ between adjacent ones of the four spaced electrodes as shown in FIG. 3 such that the electrode structure has the velocity of a uniform two-electrode-per-wavelength structure with substantially no reflections. A separation distance of 5λ/8 is shown separating the electrodes of adjacent groups. This spacing is simply to bring the transduction of the transducer in phase from one group 23 to the adjacent groups 32 and 34.

Figure 4A:
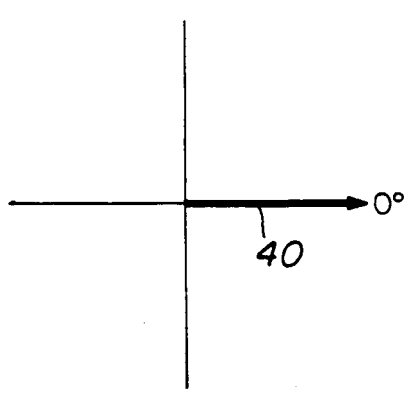
FIGS. 4A-D are graphical representations of the reflections within the 2λ group of electrodes to illustrate the cancellation of reflections and the provision of a reflectionless transducer structure.
Figure 4B:
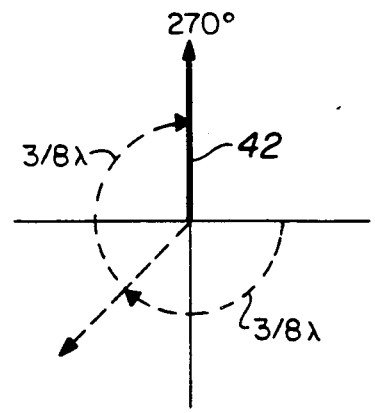
Figure 4C:
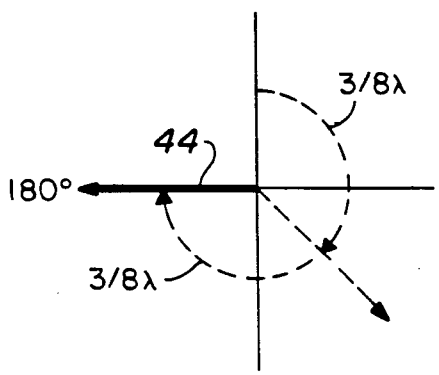
Figure 4D:
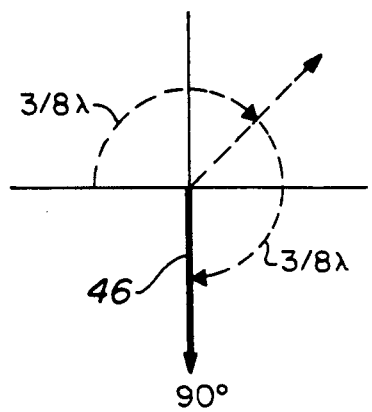

Wave phase cancellation in group 23, shown in FIG. 3, occurs because of the wave reflection characteristics between the various electrodes Consider the diagram in FIGS. 4A-D concerning the reflections for any one electrode in relation to the other electrodes. In FIG. 4A, the vector 40 at 0° represents the reflected wave relative to any point of origin in the 2λ distance in FIG. 3 as, for example only, the center of electrode 24. As shown in FIG. 4B, the incoming wave travels an additional 3/8λ distance to the neighboring electrode 26 and then an additional 3/8λ back to the electrode 24. Thus, the reflected wave is received back at electrode 24 at 270° from the origin or starting point. As shown in FIG. 4C, the wave will also travel 6/8λ to the next electrode 28 and another 6/8λ back where it is now 180° out of phase with the wave origin as shown in FIG. 4A. Also, as shown in FIG. 4D, the wave will also travel 9/8λ to the next electrode 30 and 9/8λ back where it is now at 90° as shown by the vector 46 which is 180° out of phase with the vector 42 shown in FIG. 4B. In like manner, the vector 44, shown in FIG. 4C, is 180° out of phase with the vector 40 shown in FIG. 4A. When considering all of the electrodes in a like manner, it will be seen that the net amplitude of the reflected waves from group 23 is 0. Thus, the 2λ group structure 23 in FIG. 3 has a theoretical reflection coefficient, K =0, and an actual reflectivity of substantially K =0 and substantially cancels any reflection. Yet it has the same velocity as a two-electrode-per-wavelength transducer because it has an equal metallization ratio with the free surface area and the same number of electrode edges which store energy as the two-electrode-per-wavelength structure. Such a structure can be continued indefinitely during the length of the entire grating or transducer and cause the entire structure to be nonreflective if desired or can be used in withdrawal weighting methods by selectively causing some of the electrode reflections in selected 2λ regions to be zero and thus effectively remove them from the electrode structure as far as reflections are concerned even though they are physically left in the structure and, thus, maintain a constant velocity through the structure. Not only is this easy to accomplish physically and will allow any predetermined variation in reflectivity as desired, but provides results comparable to withdrawal weighting. It also allows a mask to be constructed utilizing a E-beam technique, well known in the art, since all the electrodes lie on a fixed grid position, thus allowing the beam to be digitally stepped from one location to another in forming the electrodes. In the prior art, this is not possible because the spacing when adjusted by withdrawal weighting becomes irregular and at intervals which are not multiples of λ/8.

Thus, the structure illustrated in FIG. 3 has several advantages. It can, for instance, be used for a center grating in the resonator of FIG. 1 or the resonator of FIG. 2 where a constant velocity is required in the free space 18 and yet no reflections are wanted. Further, in the coupled resonator of FIG. 2, it is important to have transducers 12 and 14 that have no reflections. Such transducers and gratings can be formed according to the diagram illustrated in FIG. 3 and the desired achievements are attained.

Figure 5:
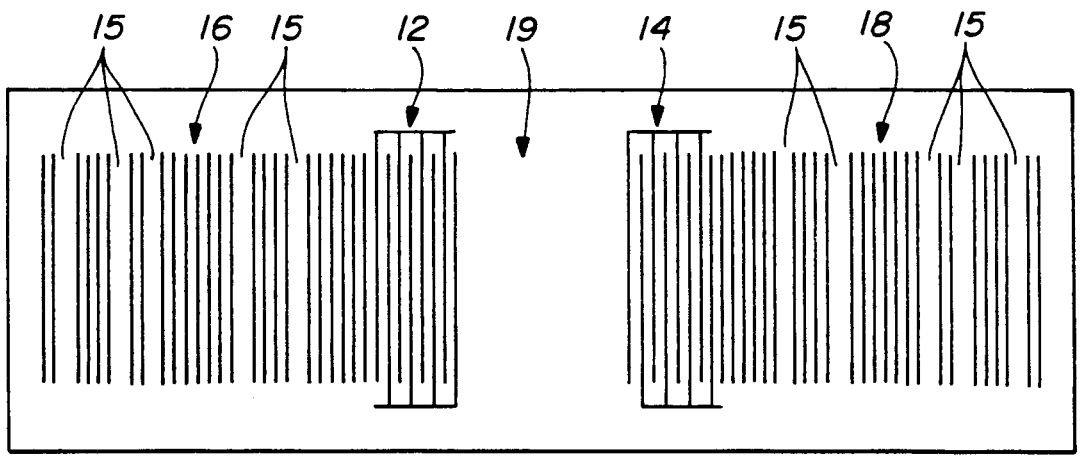
FIG. 5 is a schematic representation of a prior art resonator in which the external gratings have been withdrawal weighted to obtain a weighted reflectivity and which can be modified by the use of the present invention without removing electrodes that provides a weighted reflectivity and constant velocity.

The novel electrode structure having K =0, or no reflections, as illustrated in FIG. 3, can be used advantageously in the resonator structure of FIG. 5 because the electrodes are effectively removed from the transducer insofar as reflectivity is concerned because their reflectivity is reduced to zero. At the same time, however, a constant velocity is maintained through the grating because the electrodes are physically present Thus, in the areas 15 illustrated in FIG. 5 of the prior art, the present invention can be inserted for every 2λ wavelength of electrodes that needs to be withdrawal weighted or needs to have a reflectivity of zero. As stated previously, this structure can be continued indefinitely during the length of the entire grating or transducer. Thus, the gap 15 in FIG. 5 can be either one group or several groups of electrodes of the present invention as necessary to provide the proper reflectivity of the gratings 16 and 18 without changing the velocity through the structure. It will be seen that not only does the present structure have the zero reflectivity over a 2λ wavelength as disclosed in the commonly assigned copending application Ser. No. 510,964, but it also has a group-type response similar to that disclosed in commonly assigned copending application Ser. No. 608,354. However, the coupling strength of the group of the present invention is better than the coupling strength of the group-type structures disclosed in application Ser. No. 608,354. In that application, the transduction strength per λ, normalized to a 2λ transducer is $$\alpha/\alpha_0 = 2(1 + \cos 67.5°) \div 4. \quad (1)$$

The solution of that equation yields $$\alpha/\alpha_0 = 0.69134.$$

In the present application, the transduction strength per wavelength normalized to a 2λ transducer is
$$\alpha/\alpha_0 = (2 + 2 \cos 45°) \div 4 = 0.8536. \quad (2)$$
Thus, the coupling of the present group-type structure disclosed herein is much better than the coupling of the group-type structures previously disclosed.

It should be noted in FIG. 3 herein that the phase origin should be taken at line 21, which is at the center of the 5/8λ gap separating groups of electrodes.

One of the advantages of using the circuit of FIG. 3 to give a reflection coefficient of K =0 is that the transducer electrodes are allowed to be placed on the peak of the standing waves for maximum coupling. Generally, because the transducer electrodes have reflectivity, the electrodes are placed off the center of the standing wave peaks to reduce distortion of the response. With the present invention, the electrodes can be placed on the peak of the standing wave for maximum coupling because they have no reflections. Thus, the structure achieves the same result as split-finger electrodes without the requirement of changing the length of the cavity.

Figure 6:
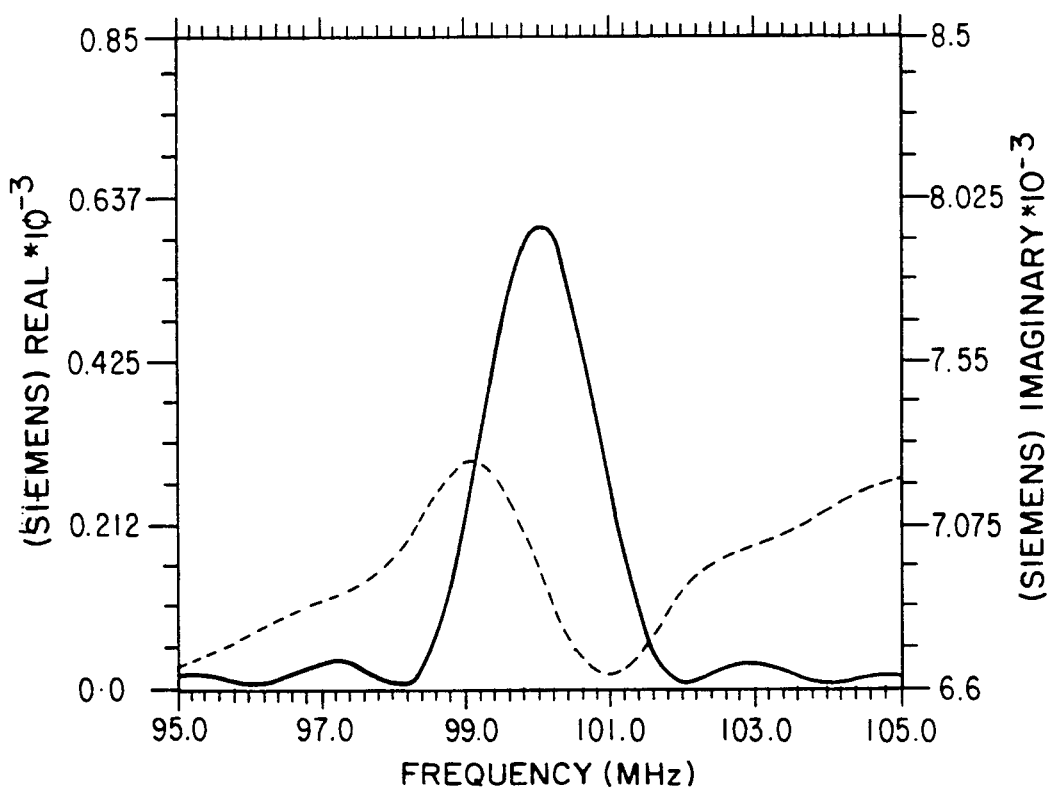
FIG. 6 is a graph illustrating the theoretical input admittance, both conductance and susceptance, of a prior art two electrode per wavelength transducer over 50 wavelengths with a theoretical reflectivity, Kappa, of K=0.
Figure 7:
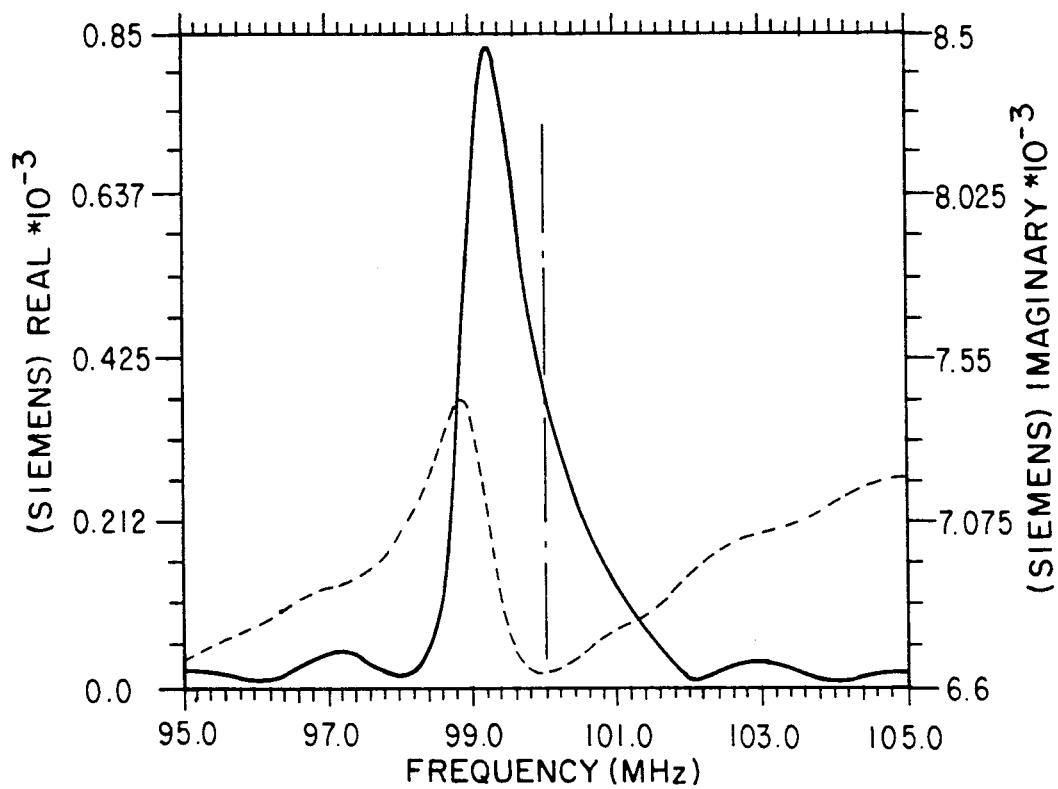
FIG. 7 is a graph of the actual input admittance, both conductance and susceptance, of a typical prior art two electrodes per wavelength transducer with a typical reflectivity of K=0.025.
Figure 8:
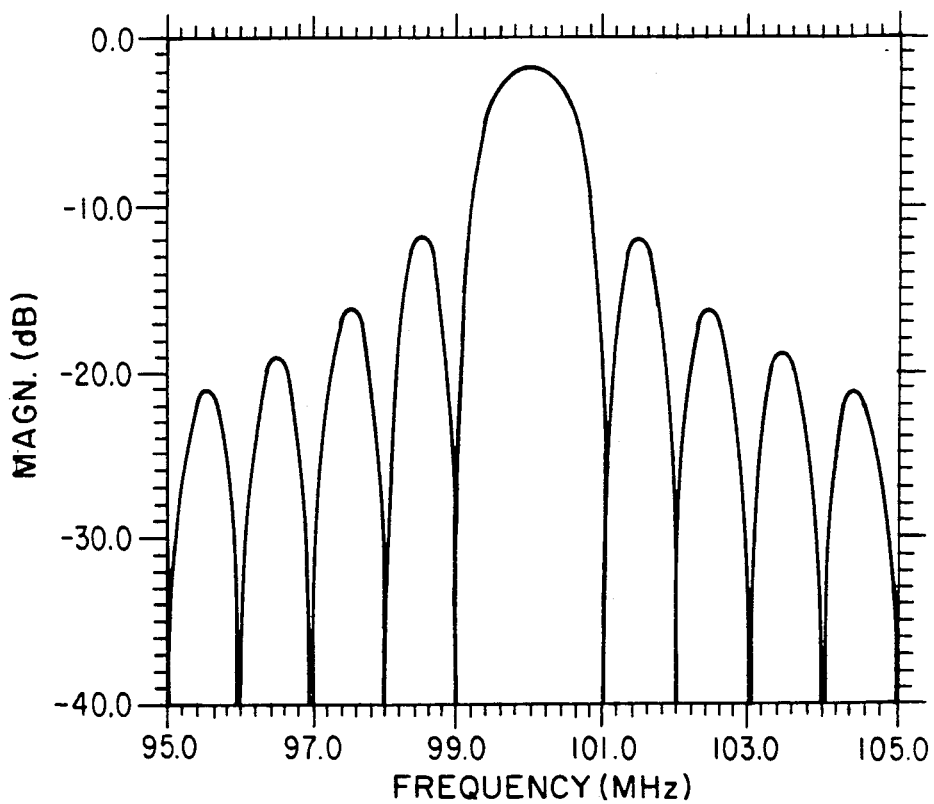
FIG. 8 is a graph of the reflection coefficient on one of the acoustic ports of a prior art two electrode per wavelength transducer with the transducer shorted and having typical reflections from the electrodes.

FIGS. 6-15 are graphs that compare the operation of prior art electrode structures with the novel electrode structure disclosed herein In FIG. 6, a graph of the theoretical input admittance, both conductance and susceptance, is shown for a typical two electrode per wavelength prior art transducer over 50 wavelengths with theoretically no reflectivity or K =0. Note that the conductance is symmetrical about the center frequency of 100 MHz. FIG. 7 is a plot of the actual admittance of a typical two-electrode-per-wavelength prior art transducer over 50 wavelengths and considering the normal reflectivity of the electrodes. It will be noted that the conductance peak has been shifted to the lower side of the center frequency. The amount of such shift depends upon the amount of reflection of the electrodes. It will also be noted that the conductance at the center frequency is decreased as compared to the theoretical structure having no reflectivity shown in FIG. 6. FIG. 8 is a graph of the reflection coefficient of a two electrode per wavelength prior art transducer looking at one of the acoustic ports with the transducer shorted. It will be noted that the reflections are high at center frequency as well as on the side lobes.

Figure 9:
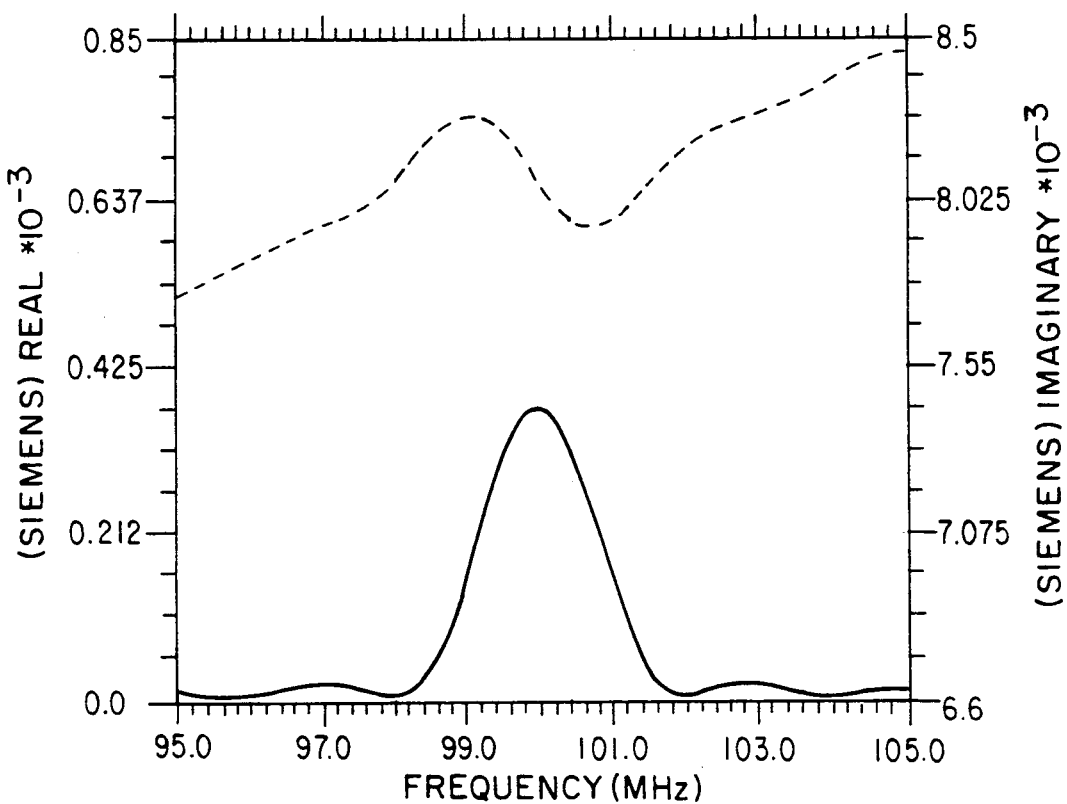
FIG. 9 is a graph of the theoretical input admittance of the novel transducer disclosed herein with each electrode having no reflections or $K=0$.
Figure 10:
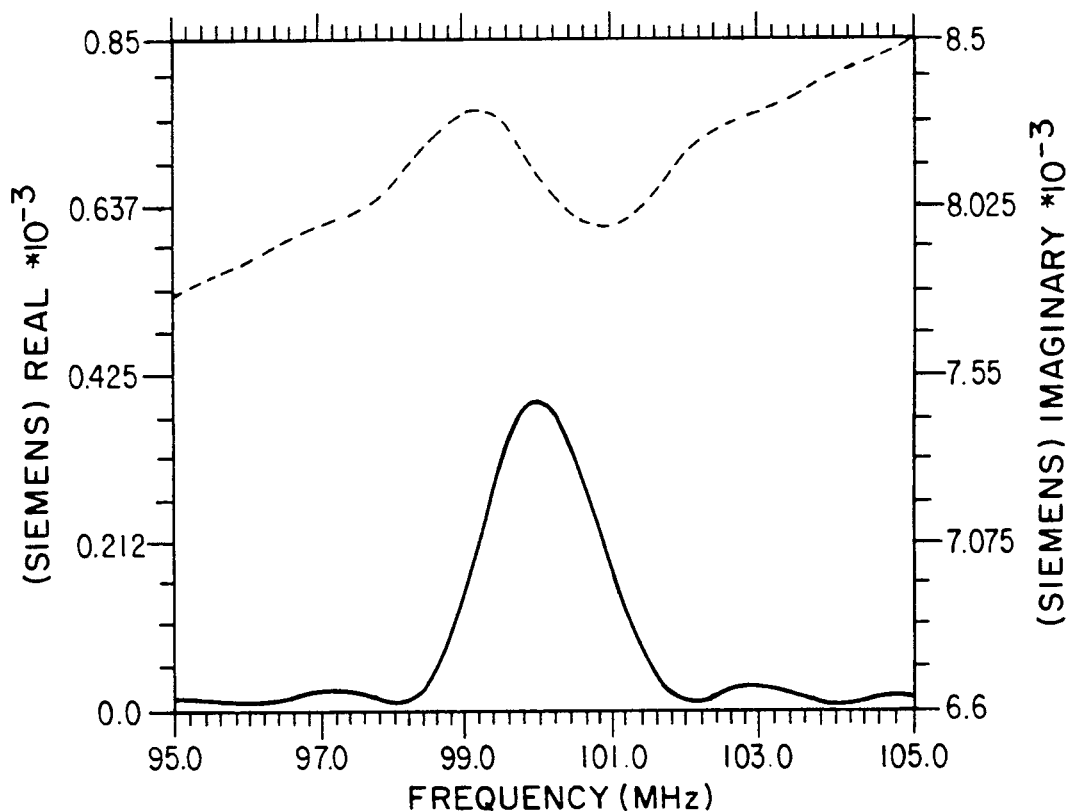
FIG. 10 is a graph of the actual input admittance of the novel electrode structure disclosed herein with each electrode having a typical reflectivity of $K=-0.025$.

FIG. 9 is a computer generated graph of the theoretical input admittance, both conductance and susceptance, of the novel transducer structure of the present invention with each individual electrode having a theoretical reflection K=0. When compared with the theoretical input admittance of the typical two electrode per wavelength structure shown in FIG. 6, it will be seen that the conductance in FIG. 9 is lower at center frequency than that in FIG. 1 of the two-electrode-per-wavelength transducer with theoretically no reflections which, of course, would be a disadvantage in comparing the two. However, when looking at FIG. 10 which is a graph of the actual input admittance of the novel electrode structure disclosed herein which has a net reflectivity of K=0 within a 2λ group of four electrodes even though each individual electrode has its own reflectivity, it will be noted that the actual conductance and the theoretical conductance of the novel electrode structure are essentially identical. It will be noted that the peak is at the center of the desired frequency, that it is slightly higher than the conductance of a typical prior art two-electrode-per-wavelength structure at the center frequency as shown in FIG. 7 and that the conductance is symmetrical; whereas, in FIG. 7 it is not. All of the these features are advantageous when compared to the prior art two-electrode-per-wavelength structure.

Figure 11:
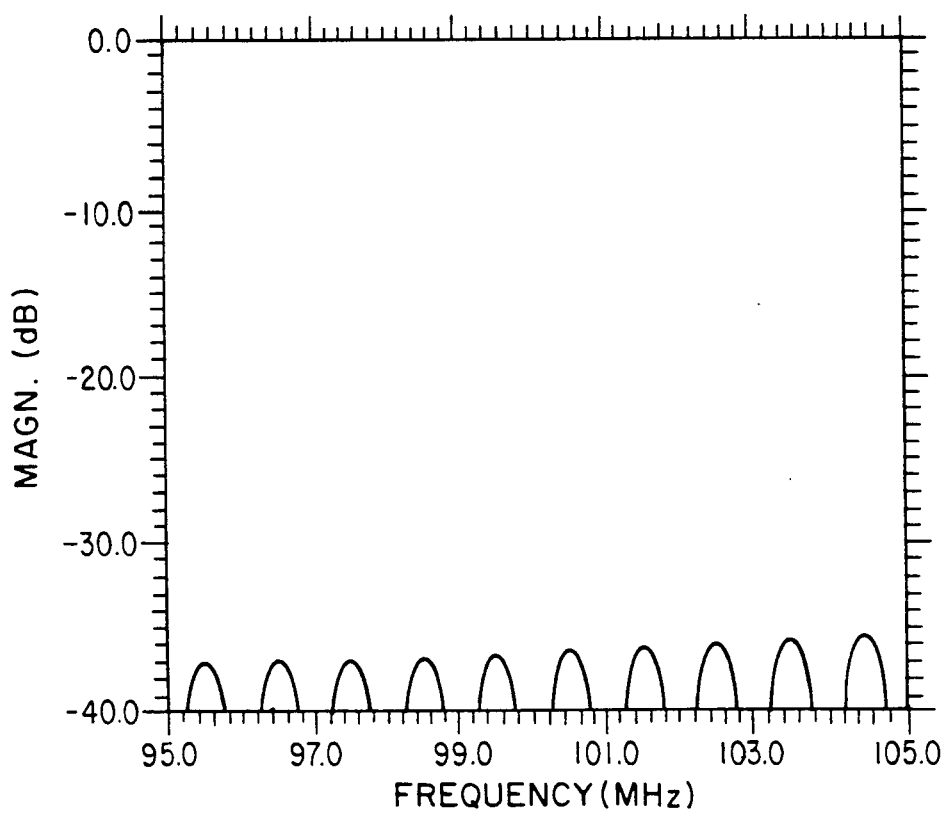
FIG. 11 is a graph of the reflection coefficient of the novel electrode structure disclosed herein.
Figure 12:
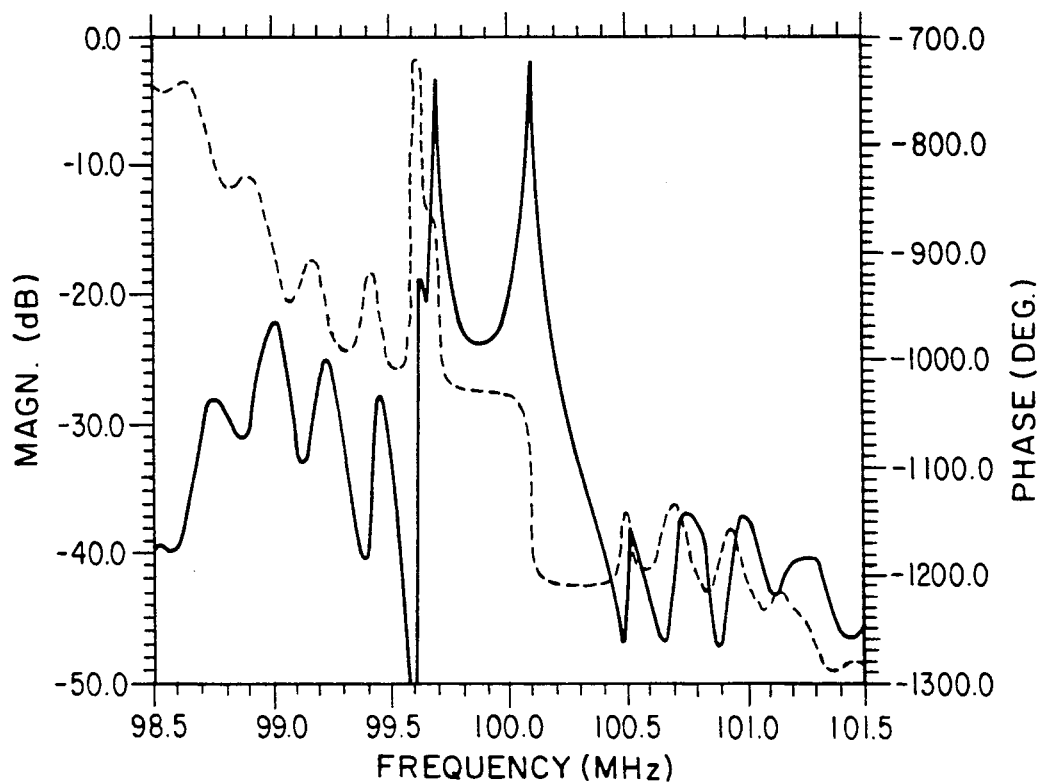
FIG. 12 is a graph of the frequency response of both phase and amplitude of a two-pole resonator using conventional two electrode per wavelength transducers with the transducers unmatched and maximally coupled to the standing waves in the cavity.

FIG. 11 is a graph of the actual reflection coefficient of the novel electrode structure disclosed herein. When it is compared to the reflection coefficient of the typical two-electrode-per-wavelength transducer shown in FIG. 8, it will be seen that the reflection coefficient of the present structure is essentially 0. It is almost 40 dB down and thus would have no practical adverse effect. Thus, there is essentially no reflections from the novel structure as a group. FIG. 12 is a graph of the frequency response of a conventional two-electrode-per-wavelength two-pole resonator where the transducers are coupled to the standing waves at maximum. It will be noted that the two highest peaks are not centered about the center frequency but have moved to the left in FIG. 12. This frequency response is caused by the shift in the input conductance as previously explained and as illustrated in FIG. 7. It will also be noted in FIG. 12 that a large distortion in the phase response occurs close to the left uppermost peak of the amplitude response. In FIG. 12, the transducers of the two-pole resonator are unmatched.

Figure 13:
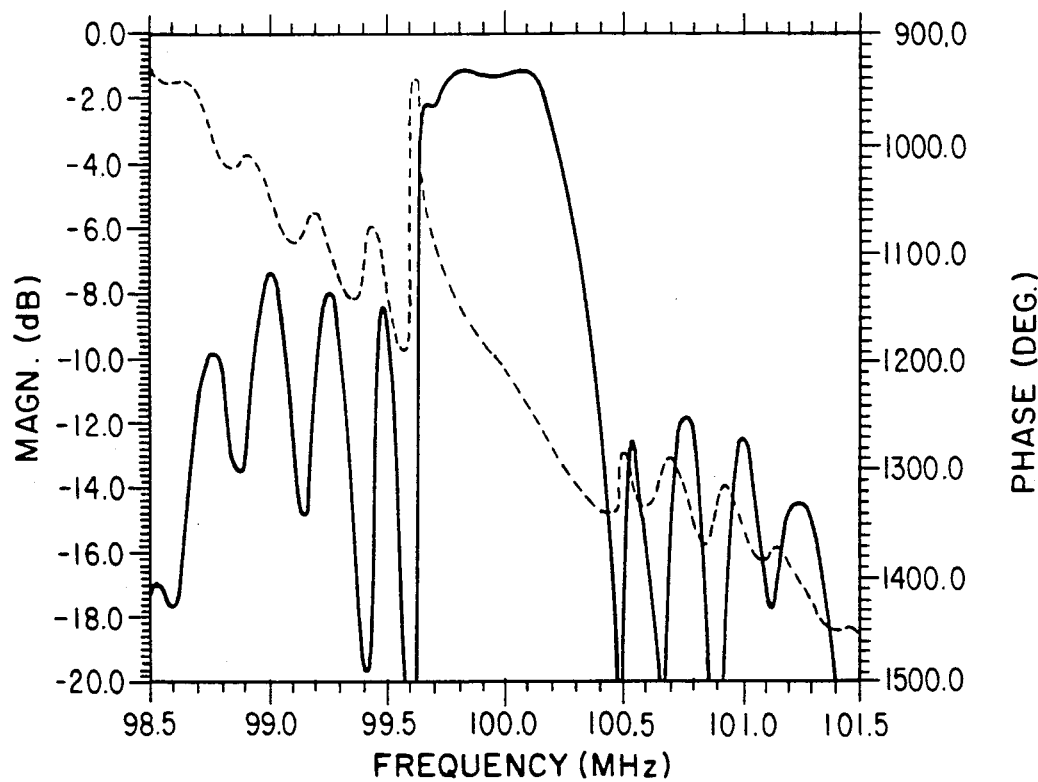
FIG. 13 is a graph of the frequency response of a prior art two-pole resonator using conventional two electrode per wavelength transducers with the transducers being matched and maximally coupled to the standing waves in the cavity.
Figure 14:
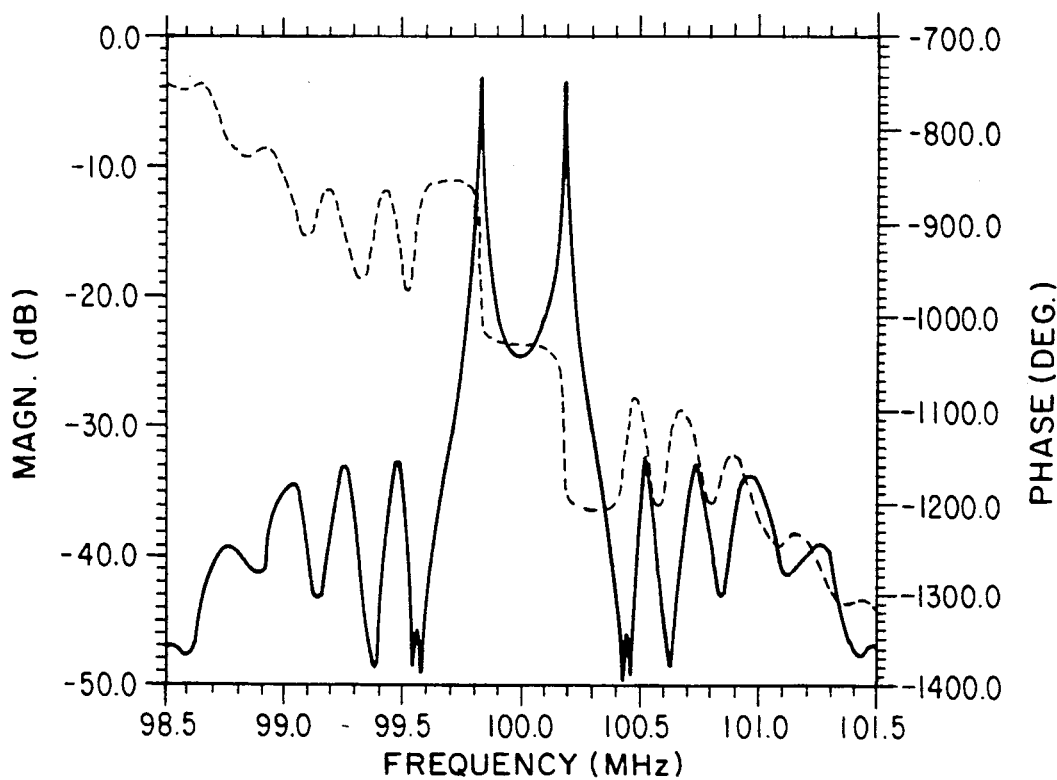
FIG. 14 is a graph of the frequency response, both amplitude and phase, of a two-pole resonator using the electrode structure of the present invention with unmatched transducers.
Figure 15:
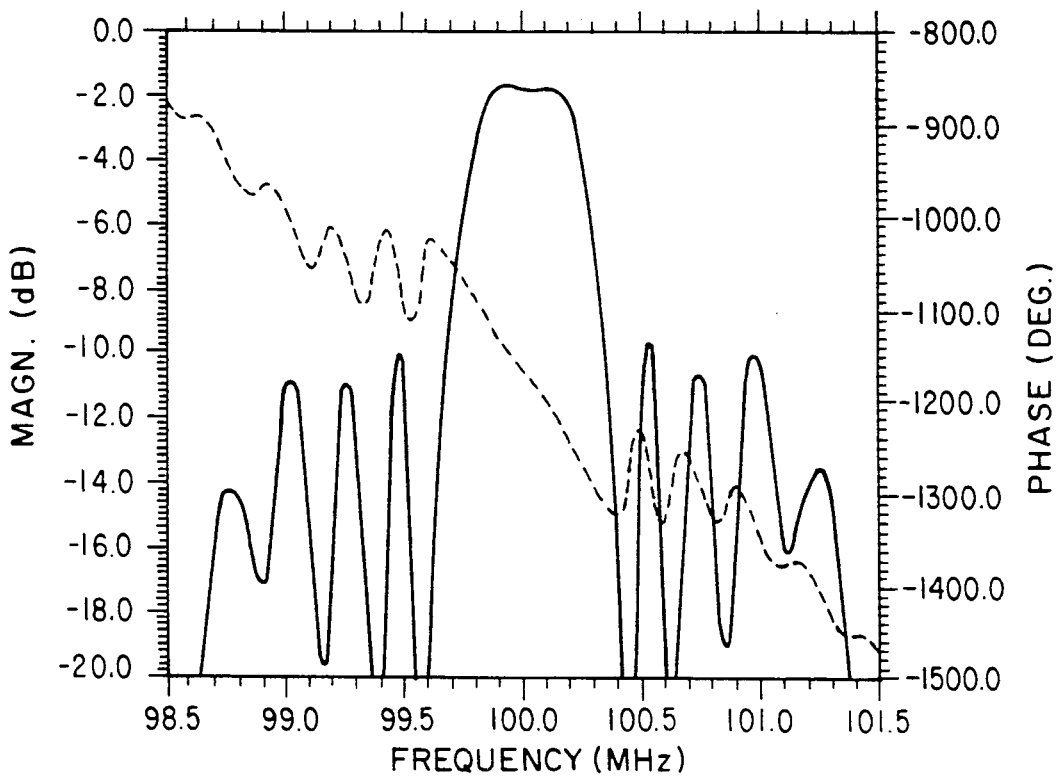
FIG. 15 is a graph of the frequency response, both amplitude and phase, of a two-pole resonator utilizing the electrode structure of the present invention with the transducers matched.

FIG. 13 illustrates the frequency response of conventional two-electrode-per-wavelength two-pole resonator with the transducers matched. Again, it will be noted that the pass band is not centered about the center frequency and that the strong phase distortion still occurs on the left side of the pass band. Note also that there are high lobes on both sides with the lobes on the left side being higher than those on the right. FIG. 14 is the frequency response of a two-pole resonator utilizing the electrode structure of the present invention with unmatched transducers. Note that the amplitude response is centered about the center frequency of 100 MHz. Note also that the amplitude is generally symmetric on both sides of the center frequency. All side lobes are not only reduced in magnitude, but are also symmetrical. Further, the large distortion in the phase response has been substantially reduced. FIG. 15 is a graph of the frequency response of the two-pole resonator utilizing the electrode structure of the present invention where the transducers are matched It will be noted that the pass band is centered about the center frequency, that the pass band and the side lobes are generally symmetrical and that there is an overall generally symmetrical response. It will be seen that the symmetry is not affected by the reflection of each individual electrode. Thus, as stated earlier, the electrodes of the present novel structure each has reflectivity but the net reflections within each group are cancelled within the group of electrodes. However, the reflection of each individual electrode has no adverse effect since the net reflectivity is cancelled within each group.

The present invention enables the construction of electrode structures which have either zero reflectivity or a predetermined variable reflectivity between a maximum and a desired minimum while maintaining the velocity constant. These features allow a great many advantages in the construction of resonators and coupled resonators. Transducers can be made for resonators which have zero reflectivity and center gratings can then be placed on the peaks of the standing waves for maximum coupling. External gratings can be easily tailored to produce any desired tapered reflectivity for the purpose of reducing side lobes and phase distortion. Further, the electrode pattern does not vary with a change of metallization or metal thickness. Also, an E-beam technique can be used to perform production masks.

While the invention has been described in connection with a preferred embodiment, it is not intended to limit the scope of the invention to the particular form set forth, but, on the contrary, it is intended to cover such alternatives, modifications and equivalents as may be included in the spirit and scope of the invention as defined by the appended claims.

I claim:

1. An electrode structure for transducing acoustic waves in a surface acoustic wave device comprising:
    a piezoelectric substrate;
    a group of only four spaced electrodes on the substrate for each 2λ distance of electrode structure;
    each of the electrodes having a width of substantially λ/4;
    a center-to-center spacing of substantially 3/8λ between adjacent ones of the four spaced electrodes such that the electrode structure has the velocity of a uniform two-electrode-per-wavelength structure with substantially no reflections; and
    a space between adjacent groups of electrodes of substantially 5/8λ to maintain the transduction phase between groups.

2. An electrode structure as in claim 1 wherein the structure is used in a surface acoustic wave transducer.

3. An electrode structure as in claim 1 wherein the structure is used in a grating in a surface acoustic wave device.

4. An improved surface acoustic wave transducer structure comprising:
- a plurality of groups of interdigitated electrodes on a piezoelectric substrate;
- each group having four spaced electrodes for each $2\lambda$ distance of transducer structure;
- each electrode in each group having a $\lambda/4$ width;
- the groups of electrodes lying on a $3/8\lambda$ grid such that adjacent electrodes within each group have a center-to-center spacing of substantially $3/8\lambda$ where $\lambda$ = one wavelength; and
- each group of electrodes being separated from adjacent groups of electrodes by a $5/8\lambda$ space so as to create a transducer having the velocity of a uniform two-electrode-per-wavelength structure with substantially no reflections.

5. An improved grating structure for a surface acoustic wave device comprising:
- a plurality of groups of interdigitated electrodes on a piezoelectric substrate;
- each group having four spaced electrodes for each $2\lambda$ distance of grating structure;
- each electrode in each group having a $\lambda/4$ width;
- the groups of electrodes lying on a $3/8\lambda$ grid such that adjacent electrodes within each group have a center-to-center spacing of substantially $3/8\lambda$ where $\lambda$ = one wavelength; and
- each group of electrodes being separated from adjacent groups of electrodes by a $5/8\lambda$ space so as to create a transducer grating having the velocity of a uniform two electrode-per-wavelength grating and substantially no reflections.

6. A withdrawal weighted electrode structure for a surface acoustic wave device comprising:
- a piezoelectric substrate having multiple $\lambda/4$ electrodes thereon with center-to-center spacing of $\lambda/2$;
- selected $2\lambda$ portions of the electrodes each having a group of only four spaced electrodes each having a width of $\lambda/4$ and a center-to-center spacing of $3/8\lambda$ between adjacent ones of the four spaced electrodes in each group; and
- a $5/8\lambda$ spacing between each group of four electrodes and the nearest adjacent electrode so as to form an electrode structure having a predetermined reflection coefficient, K, and a constant velocity of a uniform two-electrode-per-wavelength structure.

7. A structure as in claim 6 wherein the structure is a surface acoustic wave transducer.

8. A structure as in claim 6 wherein the structure is a surface acoustic wave grating.

9. A resonator having external gratings separated by spaced transducers with the gratings and the transducers having only two $\lambda/4$ electrodes per wavelength, $\lambda$, and the same velocity, the gratings having a predetermined reflection coefficient, K, the resonator comprising:
- a piezoelectric substrate;
- first and second spaced gratings attached to the substrate;
- input and output spaced transducer structures attached to the substrate between the first and second gratings for generating standing waves in the substrate;
- each of the first and second gratings being formed as one continuous electrode structure;
- a group of only four electrodes in selected wavelengths, $2\lambda$, of the continuous electrode structures for withdrawal weighting the gratings;
- each electrode in each group having a width of $\lambda/4$ and a center-to-center spacing between adjacent electrodes of $3/8\lambda$; and
- a space of $5/8\lambda$ separating adjacent groups of electrodes so as to have substantially no reflectivity in each group and the same velocity as a standard two-electrode-per-wavelength transducer.

10. A resonator as in claim 9 wherein the resonator has a middle grating to form a coupled resonator.

11. A resonator as in claim 10 wherein said middle grating has a velocity identical to the velocity of the transducers and the external gratings and has no reflections 12. A coupled resonator having external gratings separated by spaced transducers and having a center grating, all of which have only two electrodes per wavelength, $\lambda$, and all of which have the same velocity, the coupled resonator comprising:
- a piezoelectric substrate;
- first and second spaced gratings attached to the substrate;
- input and output spaced transducer structures attached to the substrate between the first and second gratings for generating standing waves in the substrate;
- a center grating located between the input and output transducer structures to couple the transducer structures acoustically;
- the center grating being formed of a plurality of groups of electrode structures;
- each group of electrodes having only four spaced electrodes for each $2\lambda$ distance of electrode structure;
- each electrode in each group having a width of $\lambda/4$ and a center-to-center spacing between adjacent electrodes of $3/8\lambda$; and
- a space of $5/8\lambda$ separating adjacent groups of electrodes so as to have substantially no reflectivity in each group and the same velocity as the transducers and the external gratings.

13. A method of forming an electrode structure for use in transducers and gratings in a surface acoustic wave device, the structure having no reflections and a velocity that is constant, the method comprising the steps of:
- forming groups of only four spaced electrodes on a piezoelectric substrate for each $2\lambda$ distance of structure;
- forming the electrodes with substantially identical $\lambda/4$ widths and a center-to-center spacing of $3\lambda/8$ to cause wave cancellation between the electrodes of each group; and
- forming a space of $5\lambda/8$ between adjacent groups of electrodes so as to create an electrode structure with constant velocity and no reflections.

14. A method as in claim 13 further including the step of forming the electrodes with a mask that created with a digitally operated E-beam structure.

15. A method of withdrawal weighting an electrode structure for a surface acoustic wave device having multiple electrodes with only two electrodes per wavelength, $\lambda$, and a constant velocity, the method comprising the steps of:

forming multiple λ/4 electrodes on a piezoelectric substrate, the electrodes having a center-to-center spacing of λ/2;

forming a group of only four spaced electrodes in selected 2λ portions of the electrode structure, each of the electrodes in each group having a width of substantially λ/4 and a center-to-center spacing of substantially 3/8λ between adjacent ones of the four spaced electrodes in each group; and spacing each group of four electrodes and the nearest adjacent electrode with a 5/8λ spacing so as to form an electrode structure having a predetermined reflection coefficient, K, and the constant velocity of a uniform two-electrode-per-wavelength structure.

16. In a resonator structure, a piezoelectric substrate having external gratings with λ/4 electrodes that are separated by spaced transducers and having a constant velocity through the structure, the improvement comprising a center grating between the transducers having multiple electrodes, a reflection coefficient of substantially 0, and a constant velocity that is essentially the same as the velocity of the remainder of the structure;

the center grating comprising a group of only four spaced electrodes on the substrate for each 2λ distance of electrode structure forming the center grating;

each of the electrodes having a width of substantially λ/4, and a center-to-center spacing of substantially 3/8λ between adjacent ones of the four spaced electrodes; and a spacing of 5/8λ between adjacent groups of electrodes such that the electrode structure has the velocity of a uniform two-electrode-per-wavelength structure with substantially no reflections.

17. In a resonator structure having spaced external gratings with λ/4 electrodes on a substrate and a constant velocity through the gratings, the improvement comprising:

spaced transducers separating the gratings, each of the transducers having multiple electrodes with a reflection coefficient of substantially 0 and a constant velocity that is essentially the same as the velocity through the external gratings;

each of the spaced transducers comprising a group of only four spaced electrodes on the substrate for each 2λ distance of transducer electrode structure;

each of the electrodes having a width of substantially λ/4;

a center-to-center spacing of substantially 3/8λ between adjacent ones of the four spaced electrodes and a 5/8λ spacing between adjacent groups of electrodes such that the electrode structure has the velocity of a uniform two-electrode-per-wavelength structure with substantially no reflections.

18. In a resonator structure having external gratings formed of λ/4 electrodes on a substrate and a constant velocity through the gratings, the improvement comprising:

spaced transducers separating the gratings, each of the transducers having a plurality of groups of four spaced electrodes for each 2λ distance of transducer electrode structure with each electrode in each group having a width of λ/4 and being spaced from each other λ/8; and a space of 5/8λ separating the electrodes in each group from the electrodes in an adjacent group.

* * * * *